(12) United States Patent
Ku et al.

(10) Patent No.: US 11,852,861 B2
(45) Date of Patent: Dec. 26, 2023

(54) LUMINOUS KEYBOARD AND OPTICAL MODULE THEREOF

(71) Applicant: Darfon Electronics Corp., Taoyuan (TW)

(72) Inventors: Shih-Yung Ku, Taoyuan (TW); Wen-Ming Hsu, Taoyuan (TW)

(73) Assignee: DARFON ELECTRONICS CORP., Taoyuan (TW)

( * ) Notice: Subject to any disclaimer, the term of this patent is extended or adjusted under 35 U.S.C. 154(b) by 142 days.

(21) Appl. No.: 17/585,699

(22) Filed: Jan. 27, 2022

(65) Prior Publication Data

US 2022/0246371 A1    Aug. 4, 2022

(30) Foreign Application Priority Data

Jan. 29, 2021    (TW) .................................. 110103600
Jan. 29, 2021    (TW) .................................. 110103601

(51) Int. Cl.
*F21V 8/00*       (2006.01)
*H01H 13/83*      (2006.01)
*H01H 13/705*     (2006.01)
*G06F 3/02*       (2006.01)

(52) U.S. Cl.
CPC ........... *G02B 6/006* (2013.01); *G02B 6/0035* (2013.01); *G02B 6/0055* (2013.01); *G06F 3/021* (2013.01); *H01H 13/705* (2013.01); *H01H 13/83* (2013.01); *H01H 2219/06* (2013.01); *H01H 2219/062* (2013.01)

(58) Field of Classification Search
CPC ...... H01H 13/00; H01H 13/705; H01H 13/83; H01H 2219/00; H01H 2219/06; H01H 2219/062; G06F 3/00; G06F 3/02; G06F 3/021; G02B 6/00; G02B 6/006; G02B 6/0035; G02B 6/0055; F21V 8/00
USPC ........................................................ 200/314
See application file for complete search history.

(56) References Cited

U.S. PATENT DOCUMENTS 5,397,867 A * 3/1995 Demeo ................ G02B 6/0043
                                                    200/314
8,714,850 B2    5/2014 Ho et al.
9,983,346 B2    5/2018 Chen
(Continued)

FOREIGN PATENT DOCUMENTS

CN    103218051 A    7/2013
CN    206931518 U    1/2018
(Continued)

*Primary Examiner* — Anthony R Jimenez
(74) *Attorney, Agent, or Firm* — McClure, Qualey & Rodack, LLP

(57) ABSTRACT

A luminous keyboard includes a keyswitch module and an optical module disposed under the keyswitch module. The keyswitch module includes a plurality of keyswitches. The optical module includes a mask film and a light guide sheet. The mask film has a mask pattern. The mask pattern defines a plurality of light-transparent regions respectively corresponding to the plurality of keyswitches, and an outer light-transparent region of the plurality of light-transparent regions has a boundary. The light guide sheet has a light-exit edge. The vertical projection of the light-exit edge of the light guide sheet on the mask film at least partially falls within the outer light-transparent region and is not parallel to the boundary.

16 Claims, 7 Drawing Sheets

(56) References Cited

U.S. PATENT DOCUMENTS

| | | |
|---|---|---|
| 10,593,492 B1 | 3/2020 | Ho et al. |
| 2016/0342222 A1 | 11/2016 | Hsu et al. |
| 2020/0401235 A1 | 12/2020 | Liang |

FOREIGN PATENT DOCUMENTS

| | | |
|---|---|---|
| CN | 206931520 U | 1/2018 |
| CN | 108511240 B | 10/2019 |
| CN | 111489906 A | 8/2020 |
| CN | 211604989 U | 9/2020 |
| CN | 211788758 U | 10/2020 |
| IN | 206931520 U | 1/2018 |
| IN | 211788758 U | 10/2020 |
| TW | 201606830 A | 2/2016 |
| TW | M527120 U | 8/2016 |
| TW | 201701317 A | 1/2017 |
| TW | I668392 B | 8/2019 |
| TW | 202029247 A | 8/2020 |
| TW | M603188 U | 10/2020 |

\* cited by examiner

LUMINOUS KEYBOARD AND OPTICAL MODULE THEREOF

BACKGROUND OF THE INVENTION

1. Field of the Invention

The invention generally relates to a luminous keyboard and an optical module thereof. Particularly, the invention relates to a luminous keyboard applicable for a slim border design and an optical module thereof.

2. Description of the Prior Art

Keyboards are very important input devices for electronic products, especially computers. As the electronic products become miniature and light-weighted, the slim border design is one of the important research and development approaches of keyboards today. However, for luminous keyboards, the integration of the keyswitch module and the backlight module must be considered, especially the adhesion between the multiple optical films of the backlight module and the avoidance of lateral light leakage, so that the lighting uniformity between the outer keyswitch and the inner keyswitch is not easy to control. In particular, in the slim border design, as the margin of the border is reduced, the luminous keyboard generally encounters the problem of too bright or too dark at the outer keyswitches.

SUMMARY OF THE INVENTION

It is an object of the invention to provide a luminous keyboard and an optical module thereof, which modify the edge structure of the light guide sheet to compensate for the brightness of the keyswitches by edge-lighting.

It is another object of the invention to provide a luminous keyboard and an optical module thereof, which enhance the brightness of the keyswitches by edge-lighting of the light guide sheet and incorporating the mask pattern design of the mask film to achieve the stable lighting effect suitable for the slim border design.

In an embodiment, the invention provides an optical module for a luminous keyboard including a plurality of keyswitches. The optical module includes a mask film and a light guide sheet. The mask film has a mask pattern. The mask pattern defines a plurality of light-transparent regions respectively corresponding to the plurality of keyswitches, and an outer light-transparent region of the plurality of light-transparent regions has a boundary. The light guide sheet is disposed on one side of the mask film and has a light-exit edge, wherein a vertical projection of the light-exit edge of the light guide sheet on the mask film at least partially falls within the outer light-transparent region and is not parallel to the boundary.

In an embodiment, in an extending direction of the boundary, the vertical projection of the light-exit edge is concave with respect to the boundary.

In another embodiment, the invention provides an optical module for a luminous keyboard including a plurality of keyswitches. The optical module includes a mask film and a light guide sheet. The mask film has a mask pattern. The mask pattern defines a plurality of light-transparent regions respectively corresponding to the plurality of keyswitches, and an outer light-transparent region of the plurality of light-transparent regions has a boundary. The light guide sheet is disposed on one side of the mask film and has a light-exit edge and a hole, wherein a vertical projection of the light-exit edge of the light guide sheet on the mask film at least partially falls within the outer light-transparent region, and a vertical projection of the hole on the mask film falls within the outer light-transparent region.

In an embodiment, the mask film further has an auxiliary mask pattern in the outer light-transparent region, and the vertical projection of the hole at least partially overlaps the auxiliary mask pattern.

In yet another embodiment, the invention provides an optical module for a luminous keyboard including a plurality of keyswitches. The optical module includes a mask film and a light guide sheet. The mask film has a mask pattern. The mask pattern defines a plurality of light-transparent regions and a plurality of light-transparent sub-regions. The plurality of light-transparent regions respectively correspond to the plurality of keyswitches and include an outer light-transparent region. The plurality of light-transparent sub-regions are disposed adjacent to the outer light-transparent region. The light guide sheet is disposed on one side of the mask film and has a light-exit edge, wherein a vertical projection of the light-exit edge of the light guide sheet on the mask film at least partially falls within the plurality of light-transparent sub-regions.

In an embodiment, the optical module further includes a reflective film on one side of the light guide sheet opposite to the mask film, wherein a mask portion is disposed between the reflective film and the light guide sheet and adjacent to the light-exit edge.

In an embodiment, the mask portion is an adhesive layer or a mask coating.

In a further embodiment, the invention provides a luminous keyboard including a keyswitch module and the optical module described above. The keyswitch module includes a plurality of keyswitches, and the plurality of keyswitches include a switch layer. The optical module is disposed under the switch layer, so that the mask film is closer to the switch layer than the light guide sheet is, wherein the switch layer has one or more mask portions, and a vertical projection of the one or more mask portions on the mask film falls within the outer light-transparent region.

In an embodiment, the vertical projection of the light-exit edge at least partially falls within the vertical projection of the one or more mask portions.

In another embodiment, the invention provides a luminous keyboard including a keyswitch module and the optical described above. The keyswitch module includes a plurality of keyswitches, and the plurality of keyswitches include a baseplate. The optical module is disposed under the baseplate, so that the mask film is closer to the baseplate than the light guide sheet is, wherein the baseplate has a coating region corresponding to the light-exit edge of the light guide sheet.

In another embodiment, the invention provides a luminous keyboard including a keyswitch module and the optical module described above. The keyswitch module includes a baseplate and a plurality of keyswitches on the baseplate. The plurality of keyswitches include at least one outer keyswitch and at least one inner keyswitch. The outer keyswitch includes a keycap with an edge aligned with an edge of the baseplate. The inner keyswitch is disposed on one side of the outer keyswitch away from the edge of the baseplate. The optical module is disposed under the baseplate, so that the mask film is closer to the baseplate than the light guide sheet is, wherein an edge of the mask film adjacent to the boundary is substantially aligned with the edge of the baseplate.

In an embodiment, a vertical projection of the keycap of the outer keyswitch on the mask film exceeds outside the boundary of the outer light-transparent region.

Compared with the prior art, the luminous keyboard and the optical module of the invention not only enhance the brightness of the keyswitches by the edge-lighting characteristics of the light guide sheet, but also incorporate the mask pattern design of the mask film, so that the luminous keyboard is improved with the lighting uniformity and suitable for the slim border design.

DETAILED DESCRIPTION OF THE PREFERRED EMBODIMENT

The invention provides a luminous keyboard and an optical module thereof, which promotes the brightness of keyswitches, especially the outer keyswitch, so that the keyswitches can have a stable lighting effect. The luminous keyboard of the invention can be an independent keyboard or integrated into electronic devices (e.g. mobile devices, laptop computers). Specifically, the luminous keyboard can adopt the slim border design, but not limited thereto. Hereinafter, an independent computer keyboard (shown in FIG. 1) is illustrated as an example.

Figure 1:
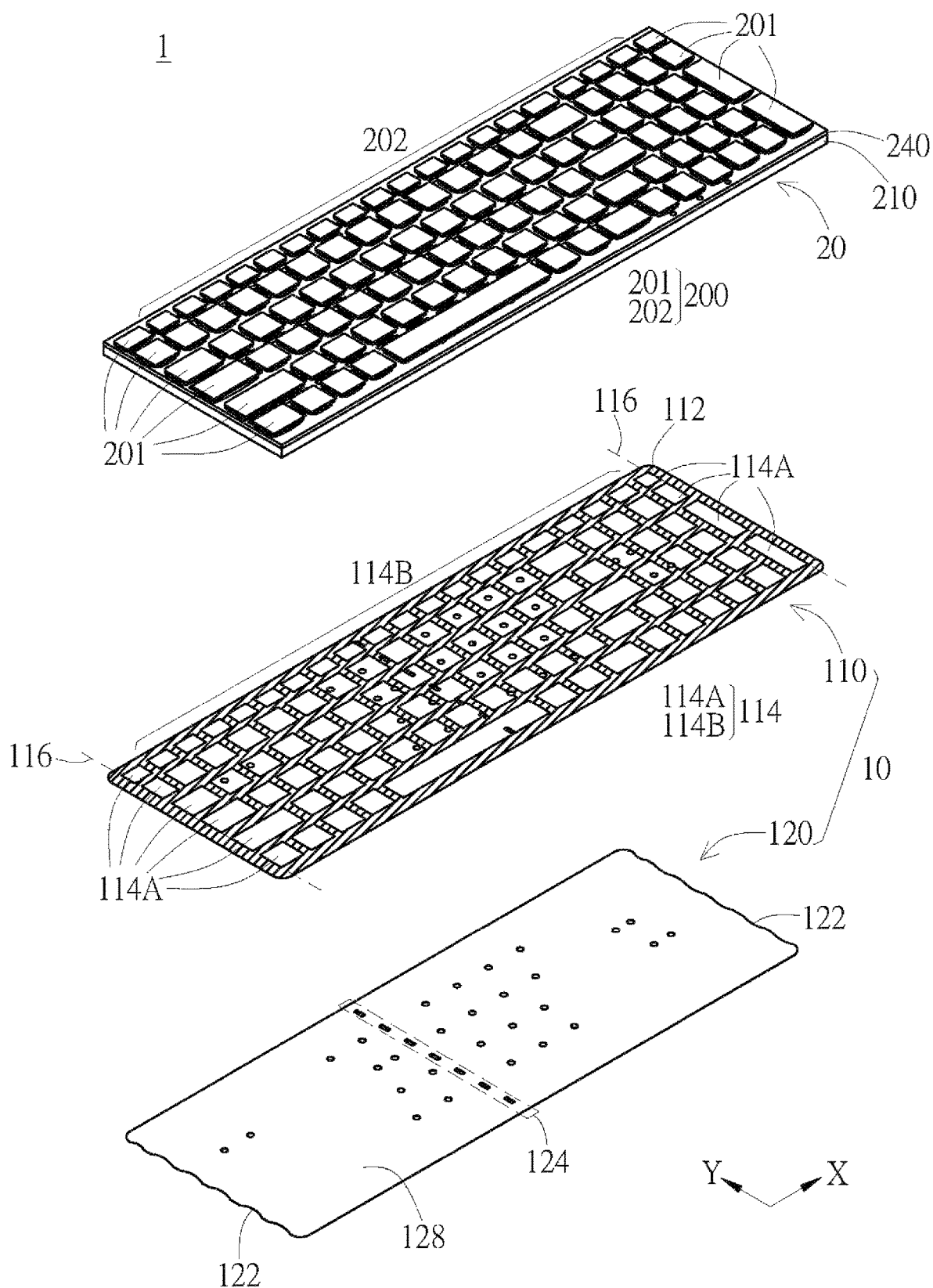
FIG. 1 is a schematic exploded view of the luminous keyboard in the first embodiment of the invention.

As shown in FIG. 1, in the first embodiment, the luminous keyboard 1 includes an optical module 10 and a keyswitch module 20. The optical module 10 is disposed under the keyswitch module 20. The keyswitch module 20 includes a plurality of keyswitches 200, and the plurality of keyswitches 200 include at least one outer keyswitch 201 and at least one inner keyswitch 202. In one aspect, the plurality of keyswitches 200 are arranged in multiple rows along the Y-axis direction, and the outmost keyswitches in each row, such as two keyswitches respectively at two ends in the X-axis direction, can be the outer keyswitches 201, and the keyswitches between the outer keyswitches 201 at the two ends can be the inner keyswitches 202. In another aspect, among the multiple rows of keyswitches arranged along the Y-axis direction, the keyswitches in the outmost rows (e.g. the topmost and bottommost rows in the Y-axis direction) can be the outer keyswitches 201, and the keyswitches between the outer keyswitches 201 in the outmost rows can be the inner keyswitches 202. In other words, the outer keyswitches 201 are not adjacent to other keyswitches by at least one side, such as the keyswitches disposed around the outer perimeter, and the inner keyswitches 202 are surrounded by other keyswitches at all sides. In this embodiment, the left edges of the outer keyswitches 201 at the left side (e.g. the left edges of the keycaps) are aligned along the Y-axis direction, and the right edges of the outer keyswitches 201 at the right side (e.g. the right edges of the keycaps) are aligned along the Y-axis direction, but not limited thereto. Moreover, the upper edges of the outer keyswitches 201 at the topmost row (e.g. the upper edges of the keycaps) are aligned along the X-axis direction, and the lower edges of the outer keyswitches 201 at the bottommost row (e.g. the lower edges of the keycaps) are aligned along the X-axis direction, but not limited thereto.

Figure 2A:
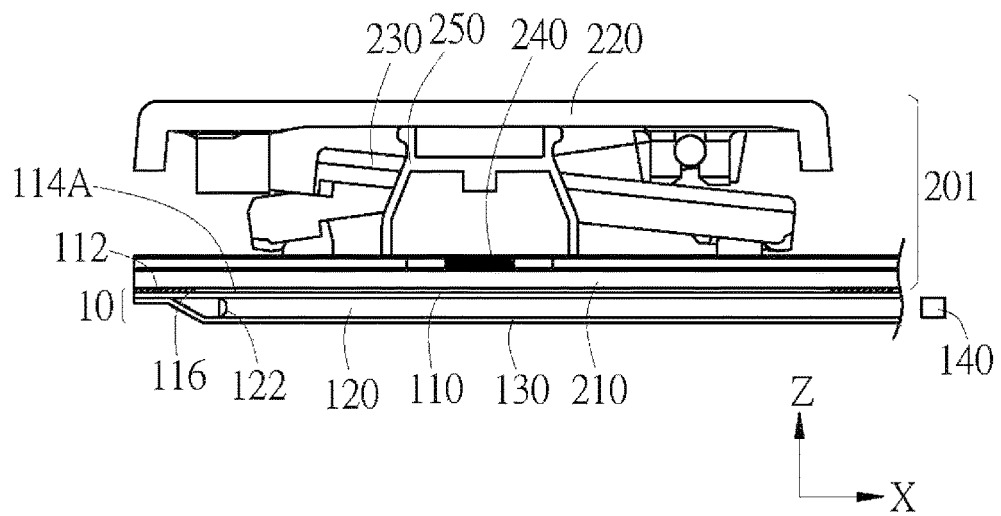
FIG. 2A is a schematic cross-sectional view of the keyswitch of the luminous keyboard of the first embodiment of the invention.

Specifically, the keyswitch 200 can be any suitable key unit with light-transparent keycap. FIG. 2A is a schematic cross-sectional view of the keyswitch of the luminous keyboard of the first embodiment of the invention. As shown in FIG. 2A, in an embodiment, the keyswitch (e.g. the outer keyswitch 201 at the left side) includes the scissor-like support mechanism 230 movably coupled with the keycap 220 and the baseplate 210 to support the keycap 220 to move relative to the baseplate 210 and compress the rubber dome 250 to trigger the switch layer 240 (e.g. membrane switch), and the rubber dome 250 provides the restoring force to enable the keycap 220 to return to its original position, but not limited thereto. In other embodiments, the scissor-like support mechanism 230 can be replaced with other up-down support mechanisms, such as butterfly-type support mechanism, sliding block support mechanism, suspension arm support mechanism. The rubber dome 250 can be replaced with other restoring units, such as magnets, spring. Moreover, the switch layer 240 can be replaced with other switch units, such as mechanical switch, optical switch. That is, the keyswitches 200 of the keyswitch module 20 can have any suitable configuration, which can generate the triggering signal after being pressed.

Referring to FIG. 1 again, the optical module 10 includes a mask film 110 and a light guide sheet 120. The mask film 110 has a mask pattern 112. The mask pattern 112 defines a plurality of light-transparent regions 114, and the plurality of light-transparent regions 114 correspond to the plurality of keyswitches 200, respectively. For example, the plurality of light-transparent regions 114 include outer light-transparent regions 114A and inner light-transparent regions 114B. The outer light-transparent regions 114A correspond to the outer keyswitches 201, and the inner light-transparent regions 114B correspond to the inner keyswitches 202. The outer light-transparent region 114A has a boundary 116. For example, the boundary 116 of the outer light-transparent region 114A at the left side is the left boundary extending along the Y-axis direction, and the boundary 116 of the outer light-transparent region 114A at the right side is the right boundary extending along the Y-axis direction. Specifically, the mask film 110 is disposed on one side of the light guide sheet 120, such as top side, and the mask pattern 112 partially allows light to pass therethrough and partially blocks light. For example, the mask film 110 can be a light-transparent optical film (e.g. polyethylene terephthalate (PET) film) with light-blocking material (e.g. ink) disposed thereon to form the mask pattern 112, so as to allow light to pass through the light-transparent regions 114 and block light at locations where the keyswitch module 20 does not require light, such as the gap between the keyswitches 200. In an embodiment, the shape and size of the mask film 110 preferably correspond to those of the baseplate 210 of the keyswitch module 20, but not limited thereto.

The light guide sheet 120 is disposed on one side of the mask film 110, such as the lower side. The light guide sheet 120 has a light-exit edge 122. The light-exit edge 122 corresponds to the boundary 116, so that a vertical projection of the light-exit edge 122 of the light guide sheet 120 on the mask film 110 at least partially falls within the outer light-transparent region 114A and is not parallel to the boundary 116, as shown in FIG. 2C. Specifically, the light guide sheet 120 can be a film-like or sheet-like plate, which can be made of any suitable optical materials, such as optical polymers. The size of the light guide sheet 120 is slightly smaller than that of the mask film 110, and the light guide sheet 110 has a light-output surface 128 corresponding to the plurality of light-transparent regions 114. For example, the size of the light guide sheet 120 in the X-axis direction is preferably smaller than that of the mask film 110, so that the edge of the mask film 110 extend beyond the light-exit edge 122 of the light guide sheet 120, facilitating the adhesion with other components, such as the reflective film, the baseplate 210. The light-exit edge 122 of the light guide sheet 120 defines the boundary of the light-output surface 128 in the X-axis direction. In this embodiment, the light guide sheet 120 has a plurality of light source holes 124, and the lateral surface inside the light source hole 124 can be the light-input surface of the light guide sheet 120. The top surface of the light guide sheet 120 (i.e., the upper surface that extends along the X-Y plane) can be the light-output surface 128 of the light guide sheet 120. Light enters the light guide sheet 120 from the light-input surface, travels along the extension direction of the light guide sheet (e.g. along the X-axis and Y-axis directions), and then emits out from the plurality of light-transparent regions 114 of the mask film 110.

As shown in FIG. 2A, in an embodiment, the optical module 10 includes one or more light sources 140, which provides light into the light guide sheet 120. As such, the optical module 10 can be a backlight module of the luminous keyboard 1. Specifically, the light source 140 is preferably a light-emitting diode (LED), such as a side-lighting LED, but not limited thereto. The light source 140 is disposed in the light source hole 124, so that the light-emitting surface preferably faces the light-input surface of the light guide sheet 120, and the light enters the light guide sheet 120 from the light-input surface. In an embodiment, a plurality of light sources 140 are preferably integrated on a circuit board to form an integrated light source unit, so as to enhance the assembly efficiency.

Moreover, as shown in FIG. 2A, the optical module 10 can optionally include a reflective film 130. The reflective film 130 is disposed on one side of the light guide sheet 120 opposite to the mask film 110, such as the lower side. The reflective film 130 is configured to reflect the light emitting from the lower surface of the light guide sheet 120 back to the light guide sheet 120. Specifically, the reflective film 130 can be a reflective film made of reflective materials (e.g. metal foil), a layer of reflective material coated on a non-reflective film, or a plastic film doped with reflective particles (e.g. PET film doped with reflective particles). The shape and size of the reflective film 130 preferably correspond to those of the mask film 110, and the malleability/deformability of the reflective sheet 130 is preferably larger than that of the mask film 110. In other words, the reflective film 130 is much more deformable than the mask film 110 is, so that the reflective film 130 is readily to be adhered.

Figure 2B:
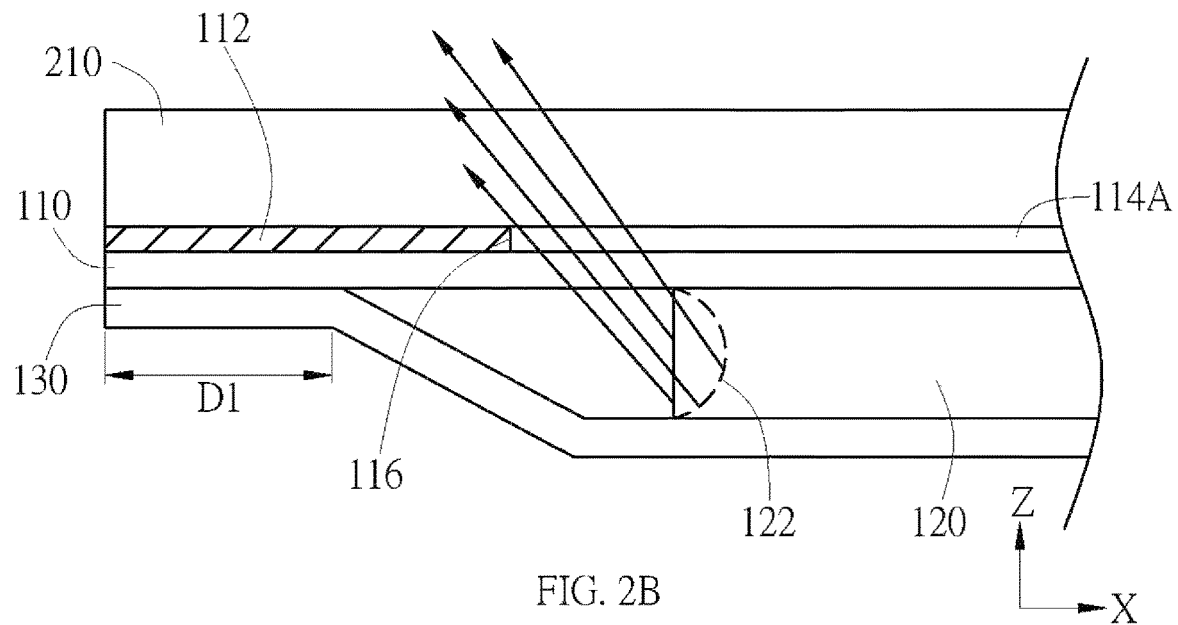
FIG. 2B is a partially enlarged view of FIG. 2A.
Figure 2C:
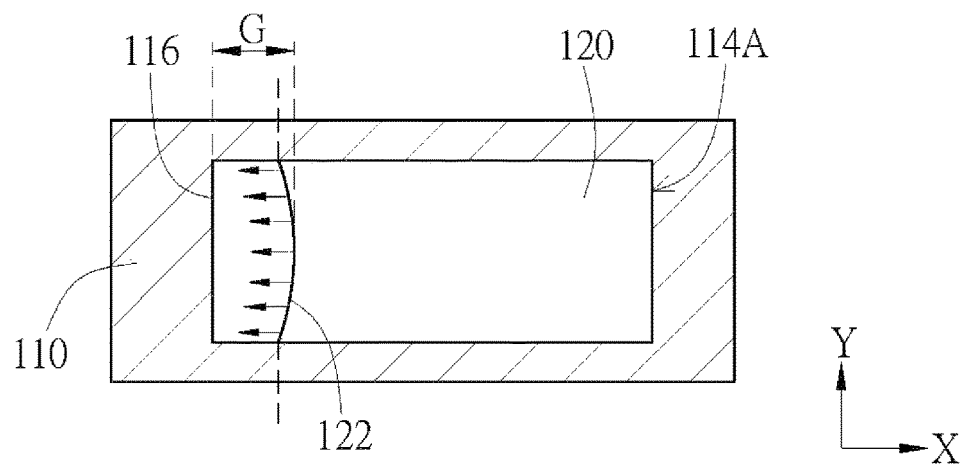
FIG. 2C is a top view of FIG. 2A showing the relative position of the outer light-transparent region of the mask film and the light-exit edge of the light guide sheet.

As shown in FIGS. 2A and 2B, FIG. 2B is a partially enlarged view of FIG. 2A, and FIG. 2B just shows the optical module 10 and the baseplate 210 of the keyswitch module 20 and omits the components (e.g. switch layer 240, rubber dome 250, scissor-like support mechanism 230, and the keycap 220) on the baseplate 210. The upper surface of the end portion of the mask film 110 is adhered to the lower surface of the baseplate 210, and the lower surface of the end portion of the mask film 110 is adhered to the upper surface of the reflective film 130, so that the light guide sheet 120 is enclosed between the mask film 110 and the reflective film 130 to prevent lateral light leakage. In this embodiment, the keycap 220 of the outer keyswitch 201 and the baseplate 210 can be flushed with the edge of the optical module 10. For example, the left edges of the keycap 220, the baseplate 210, the mask film 110, and the reflective film 130 are preferably aligned with each other along the stacking direction (e.g. the Z-axis direction) to facilitate the slim border design of the luminous keyboard 1. Specifically, in the slim border design, the size and shape of the inner light-transparent region 114B is preferably consistent with those of its corresponding keycap 220, i.e., the vertical projections of the inner light-transparent region 114B and the keycap 220 on the baseplate 210 substantially completely overlap with each other. The size and shape of the outer light-transparent region 114A is limited by the considerations of adhesion requirements and lateral light leakage, so the size of the outer light-transparent region 114A is smaller than its corresponding keycap 220. For example, the outer light-transparent region 114A is retreated from the edge of the mask film 110 by a predetermined width in the X-axis direction. In an embodiment, the adhesion width D1 of the reflective film 130 and the mask film 110 (e.g. the adhesion distance along the X-axis direction from the edge) is preferably equal to or larger than 1.5 mm, to reduce the possibility of light leakage due to the detachment of the reflective film 130 and the mask film 110 of the optical module 10 as the luminous keyboard 1 adopts the slim border design. In other words, for a single side, the size of the outer light-transparent region 114A in the X-axis is shorter than that of its corresponding keycap 220 by at least 1.5 mm. For the outer light-transparent regions 114A at both sides, the size of the light guide sheet 120 in the X-axis direction is shorter than that of the mask film 110 by at least 3.0 mm (=2×1.5 mm), but not limited thereto.

Referring to FIGS. 2B and 2C, FIG. 2C is a top view of FIG. 2A, which shows the relative position of the outer light-transparent region 114A of the mask film 110 and the light-exit edge 122 of the light guide sheet 120. In this embodiment, the vertical projection of the light-exit edge 122 of the light guide sheet 120 on the mask film 110 at least partially falls within the outer light-transparent region 114A and is not parallel to the boundary 116, so that the lateral surface (or end surface) of the light guide sheet 120 adjacent to the light-exit edge 122 can serve as a light-output surface to enhance the brightness of the outer keyswitch 201. In other words, the light guide sheet 120 is not only smaller than the mask film 110 in the X-axis direction, but the size of the light guide sheet 120 is so small that the edge of the light guide sheet 120 (i.e., light-exit edge 122) is retreated to the inner side of the boundary 116. As such, when the light guide sheet 120 and the mask film 110 are stacked together, in the X-axis direction, a gap G exists between the light-exit edge 122 and the boundary 116, and the gap G varies along the Y-axis direction. In other words, the light-exit edge 122 extends non-linearly along the Y-axis direction (or does not extend parallel to the boundary 116), so that the gap G is not a constant value in the Y-axis direction. In an embodiment, in the extending direction (e.g. the Y-axis direction) of the boundary 116, the vertical projection of the light-exit edge 122 is concave with respect to the boundary 116. In other words, the gap G at the position closer to two ends of the boundary 116 along the Y-axis direction is smaller, and the gap G at the position closer to the center of the boundary 116 in the Y-axis direction is larger. In such a configuration, part of the light can emit out earlier from the light-exit edge 122 of the light guide sheet 120, so that the light which is emitted from the lateral surface adjacent to the light-exit edge 122 is prevented from being too concentrated, thereby improving the lighting uniformity. The shape of the light-exit edge 122 can be modified according to the light energy required in practical applications, for example (but not limited to), a curve shape, a stepped shape, a zigzag shape, or any suitable shape.

Figure 3A:
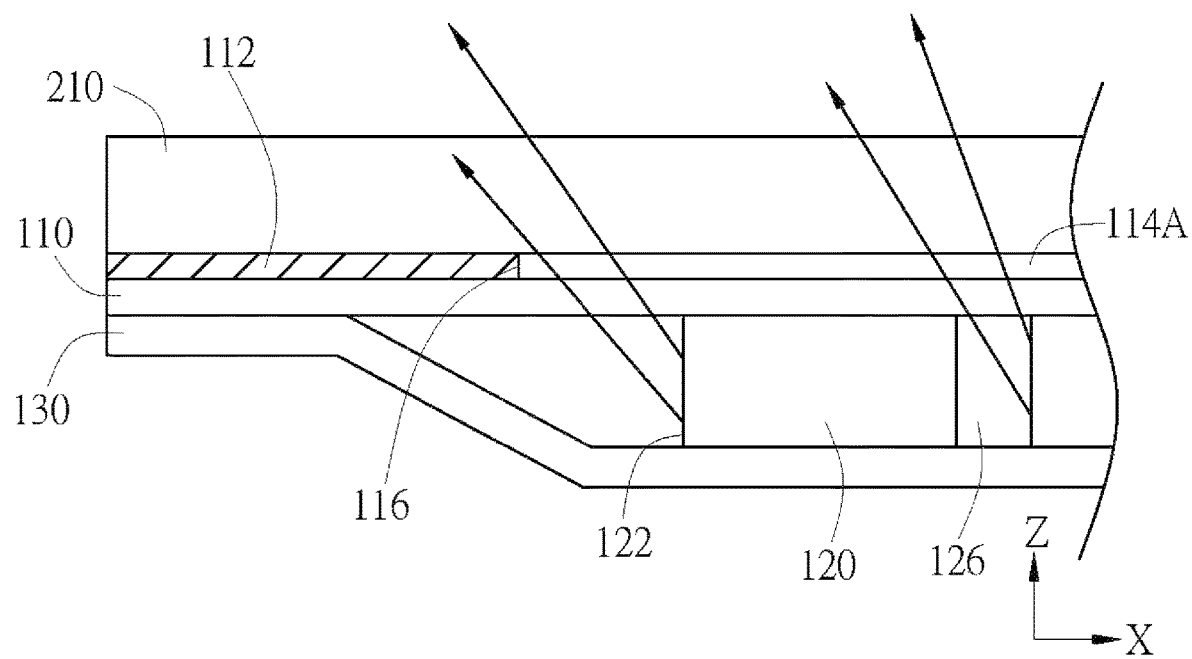
FIGS. 3A and 3B are respectively a partially enlarged cross-sectional view and a schematic top view of the keyswitch of the keyboard in the second embodiment of the invention, showing the relative position of the outer light-transparent region of the mask film and the light-exit edge of the light guide sheet.
Figure 3B:
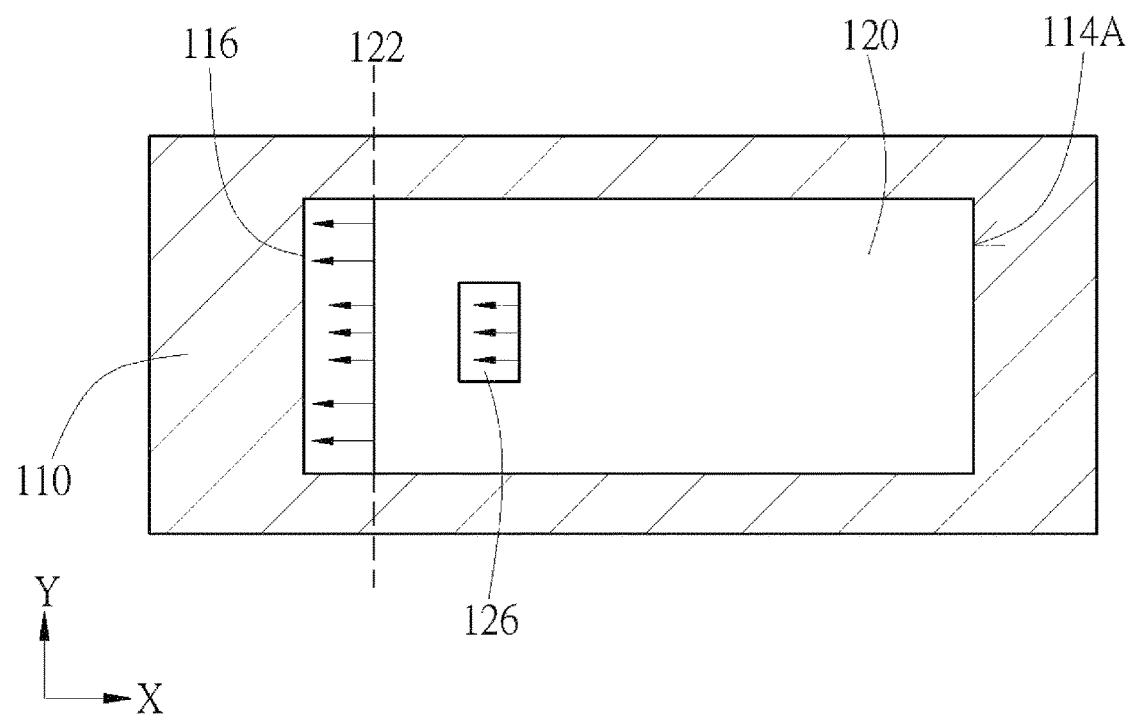

In the above embodiment, the brightness of the outer keyswitch is enhanced by the edge structure of the light guide sheet, but not limited thereto. In other embodiments, the mask film and the light guide sheet may have different modifications to enhance the brightness of the outer keyswitch. FIGS. 3A and 3B are respectively a partially enlarged cross-sectional view and a schematic top view of the keyswitch of the keyboard in the second embodiment of the invention, wherein FIGS. 3A and 3B are schematic views similar to FIGS. 2B and 2C. Hereinafter, the differences between this embodiment and the first embodiment will be explained, and other details can refer to the related descriptions of the first embodiment and will not elaborate again. As shown in FIGS. 3A and 3B, in this embodiment, the light guide sheet 120 has a light-exit edge 122 and a hole 126. The vertical projection of the light-exit edge 122 of the light guide sheet 120 on the mask film 130 at least partially falls within the outer light-transparent region 114A, and the vertical projection of the hole 126 on the mask film 130 also falls within the outer light-transparent region 114A. Specifically, the light-exit edge 122 can extend parallel to the Y-axis direction (e.g. parallel to the boundary 116), and the hole 126 of the light guide sheet 120 is located within the region corresponding to the keycap 220 of the outer keyswitch 201 to facilitate the adjustment of the light intensity from the light-exit edge 122. For example, with disposition of the hole 126, part of the light can emit out earlier from the hole 126 of the light guide sheet 120, so that the light which is emitted from the lateral surface adjacent to the light-exit edge 122 is prevented from being too concentrated, thereby improving the lighting uniformity. The hole 126 is preferably located corresponding the light-transparent portion of the keycap (e.g. the alphanumeric portion) at a farther side with respect to the light-exit edge 122, and the shape, size, and number of the hole 126 can be modified according to practical applications, not limited to the embodiment.

Figure 4:
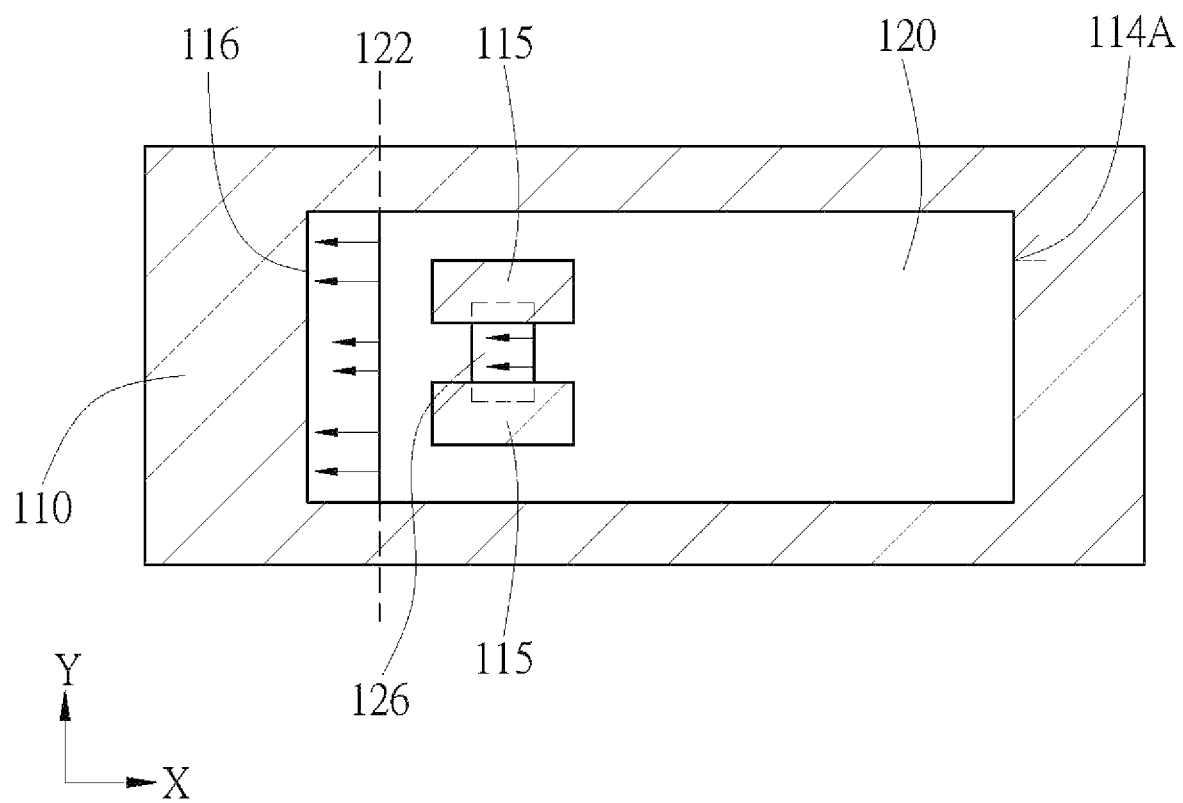
FIG. 4 is a partial top view of the keyswitch of the luminous keyboard in the third embodiment of the invention, showing the relative position of the outer light-transparent region of the mask film and the light-exit edge of the light guide sheet.

FIG. 4 is a partial top view of the keyswitch of the luminous keyboard in the third embodiment of the invention, which shows the relative position of the outer light-transparent region 114A of the mask film 110 and the light-exit edge 122 of the light guide sheet 120. FIG. 4 is a variant embodiment of FIG. 3C. Hereinafter, the differences between this embodiment and the above embodiments will be explained, and other details can refer to the related descriptions of the first and second embodiments and will not elaborate again. As shown in FIG. 4, in this embodiment, the mask film 130 further has an auxiliary mask pattern 115. The auxiliary mask pattern 115 is disposed in the outer light-transparent region 114A, and the vertical projection of the hole 126 at least partially overlaps the auxiliary mask pattern 115. Specifically, the mask film 130 can have a patterned coating, which can modulate the light intensity at the location corresponding to the hole 126 of the light guide sheet 120, so that the intensity of light emitting from the hole 126 can be controlled. For example, the auxiliary mask pattern 115 can be a stripe or any pattern of suitable shape, which is located at the side of the hole 126 perpendicular to the light-exit edge 122. For example, two stripes (e.g. the auxiliary mask pattern 115) are arranged along the Y-axis direction at two opposite sides of the hole 126. Moreover, the auxiliary mask pattern 115 can be a coating layer, which is configured to attenuate the light emitting from the hole 126, or a reflective coating, which is configured to reflect the light emitting from the hole 126 toward the reflective film 130, so as to enhance the scattering of light and the lighting uniformity.

Figure 5A:
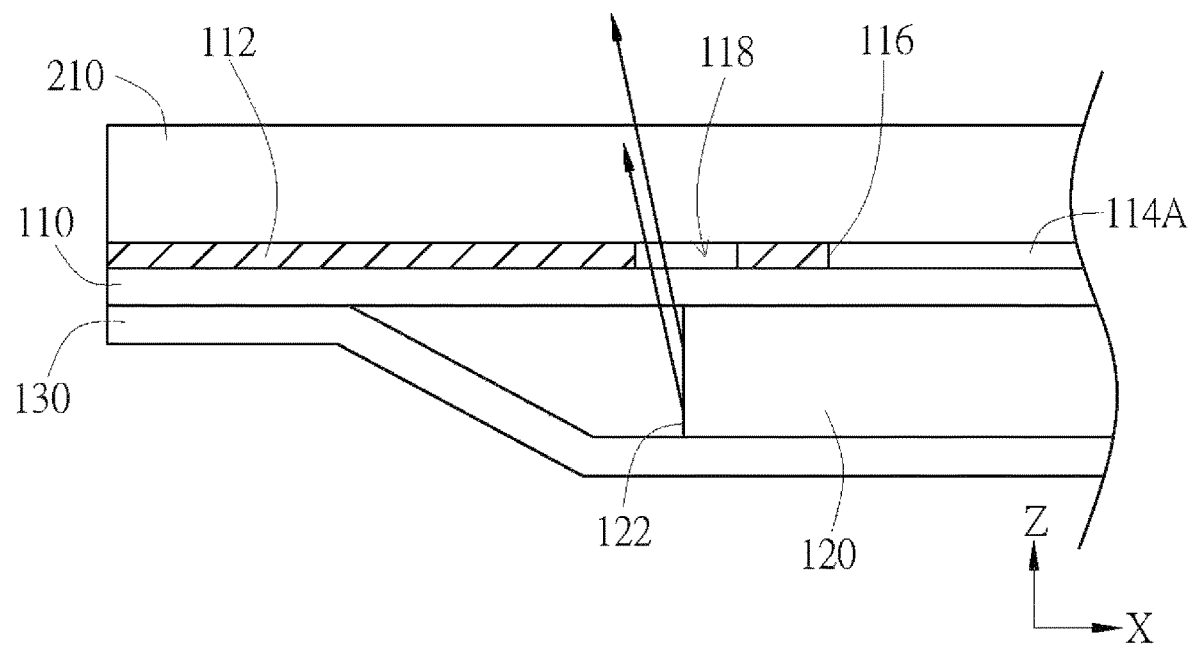
FIGS. 5A and 5B are respectively a partially enlarged cross-sectional view and a schematic top view of the keyswitch of the keyboard in the fourth embodiment of the invention, showing the relative position of the light-transparent sub-regions of the mask film and the light-exit edge of the light guide sheet.
Figure 5B:
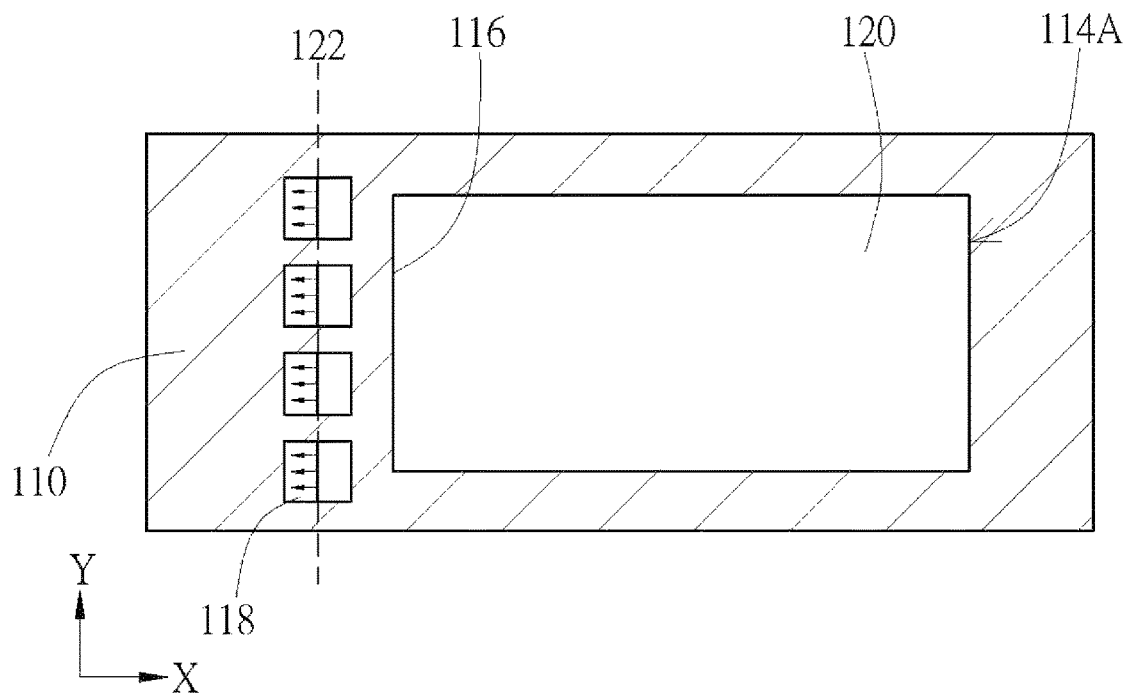

FIGS. 5A and 5B are respectively a partially enlarged cross-sectional view and a schematic top view of the keyswitch of the keyboard in the fourth embodiment of the invention, which show the relative position of the light-transparent sub-region 118 of the mask film 110 and the light-exit edge 122 of the light guide sheet 120. FIGS. 5A and 5B are schematic views similar to FIGS. 2B and 2C. Hereinafter, the differences between this embodiment and the above embodiments will be explained, and other details can refer to the related descriptions of the previous embodiments and will not elaborate again. As shown in FIGS. 5A and 5B, in this embodiment, the mask pattern 112 of the mask film 110 defines a plurality of light-transparent regions (e.g. 114, 114A/114B) and a plurality of light-transparent sub-regions 118. The plurality of light-transparent regions 114 are disposed corresponding to the plurality of keyswitches 200, respectively. The plurality of light-transparent sub-regions 118 are disposed adjacent to the outer light-transparent region 114A, and the vertical projection of the light-exit edge 122 of the light guide sheet 120 on the mask film 110 at least partially falls within the plurality of light-transparent sub-regions 118. Specifically, the light-exit edge 122 of the light guide sheet 120 may extend parallel to the Y-axis direction. The plurality of light-transparent sub-regions 118 are disposed outside the boundary 116 of the outer light-transparent regions 114A along the extending direction (e.g. Y-axis direction) of the boundary 116. In other words, the light-transparent sub-regions 118 are disposed close to the edge of the mask film 110 that is aligned with the baseplate 210. The plurality of light-transparent sub-regions 118 and its adjacent outer light-transparent region 114A correspond to the same outer keyswitch 201, so that the plurality of light-transparent sub-regions 118 and its adjacent outer light-transparent region 114A are located within the vertical projection of the keycap 220 of the outer keyswitch 201 on the mask film 110. In this embodiment, the vertical projection of the light-exit edge 122 of the light guide sheet 120 falls outside the boundary 116 of the outer light-transparent region 114A, so that the vertical projection of the light-exit edge 122 of the light guide sheet 120 at least partially falls within the plurality of light-transparent sub-regions 118. In this embodiment, four light-transparent sub-regions 118 are illustrated with the same shape and size, but not limited thereto. In other embodiments, by modifying the number and shape of the light-transparent sub-regions 118, the intensity of light emitting from the lateral surface adjacent to the light-exit edge 122 can be controlled, so that the brightness of the outer keyswitch 201 can be controlled.

Figure 6:
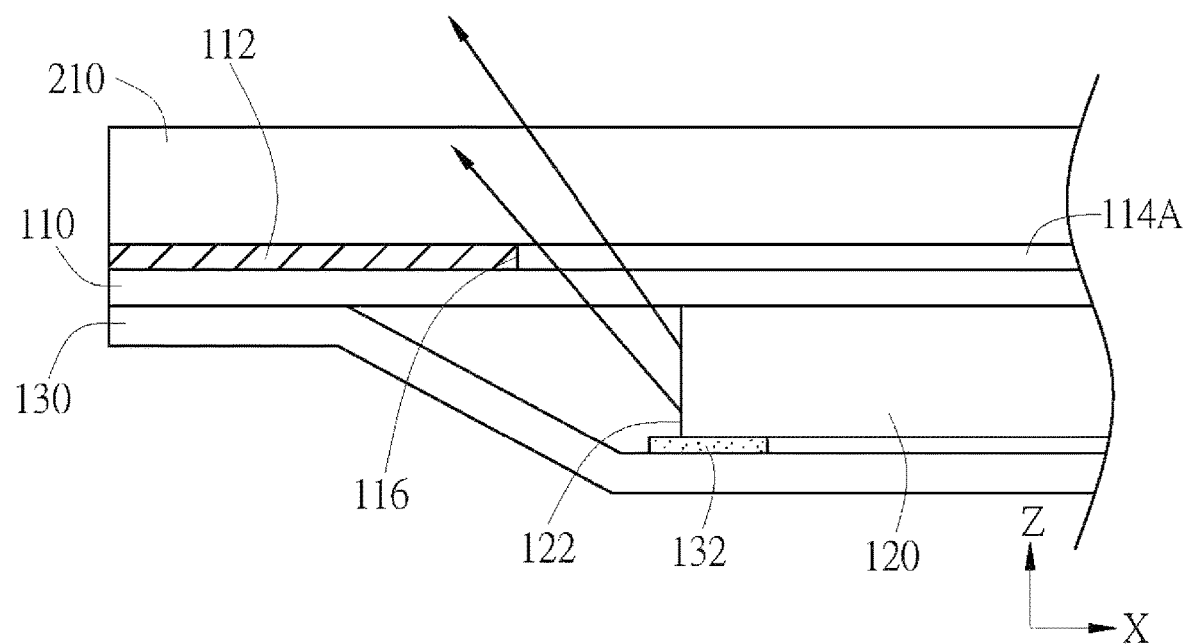
FIG. 6 is a partially enlarged cross-sectional view of the keyswitch of the keyboard in the fifth embodiment of the invention.

FIG. 6 is a partially enlarged cross-sectional view of the keyswitch of the keyboard in the fifth embodiment of the invention. FIG. 6 is a schematic view similar to FIG. 2B. Hereinafter, the differences between this embodiment and the above embodiments will be explained, and other details can refer to the related descriptions of the previous embodiments and will not elaborate again. As shown in FIG. 6, in this embodiment, a mask portion 132 is disposed between the reflective film 130 and the light guide sheet 120, and the mask portion 132 is adjacent to the light-exit edge 122. Specifically, in an embodiment, the mask portion 132 can be an adhesive layer disposed between the reflective film 130 and the light guide sheet 120 along the light-exit edge 122 and configured to absorb the light energy to attenuate the light intensity to enhance the lighting uniformity. In another embodiment, the mask portion 132 can be a mask coating (or mask pattern), which is coated on the reflective film 130 along the light-exit edge 122 and configured to locally reduce the reflective effect of the reflective film 130, so as to attenuate the light intensity to enhance the lighting uniformity.

Figure 7:
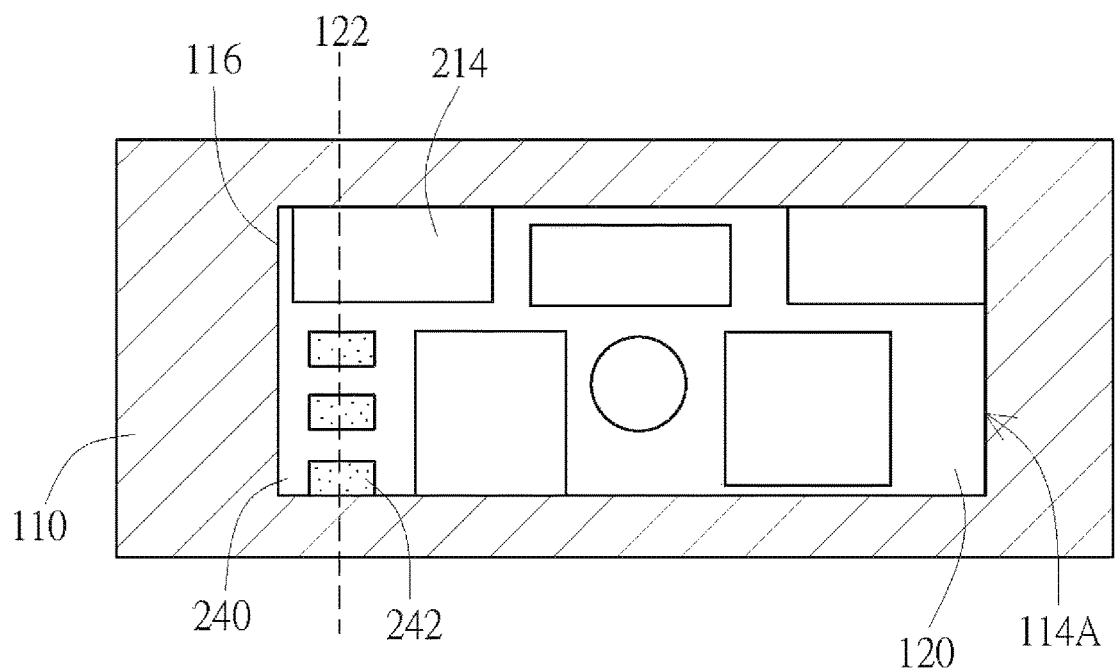
FIG. 7 is a partial top view of the keyswitch of the keyboard in the sixth embodiment of the invention, showing the relative position of the outer light-transparent region of the mask film, the light-exit edge of the light guide sheet, the opening of the baseplate, and the mask portion of the switch layer.

FIG. 7 is a partial top view of the keyswitch of the keyboard in the sixth embodiment of the invention, which shows the relative position of the outer light-transparent region 114A of the mask film 110, the light-exit edge 122 of the light guide sheet 120, the opening 214 of the baseplate 210, and the mask portion 242 of the switch layer 240. FIG. 7 is a schematic view similar to FIG. 2C. Hereinafter, the differences between this embodiment and the above embodiments will be explained, and other details can refer to the related descriptions of the previous embodiments and will not elaborate again. As shown in FIG. 7, in this embodiment, the switch layer 240 of the keyswitch module 20 has one or more mask portions 242, and the vertical projection of the one or more mask portions 242 on the mask film 110 falls within the outer light-transparent region 114A. Specifically, according to practical applications, the switch layer 240 can be disposed above or under the baseplate 210. The optical module 10 is disposed under the switch layer 240, and the mask film 110 is closer to the switch layer 240 than the light guide sheet 120 is. For example, when the switch layer 240 is disposed above the baseplate 210, the baseplate 210 can have one or more openings 214, which allows light to pass therethrough. The one or more mask portions 242 of the switch layer 240 can be formed at location corresponding to the light-exit edge 122, so that the vertical projection of the light-exit edge 122 at least partially falls within the vertical projection of the one or mask portions 242 to attenuate the light energy to enhance the lighting uniformity.

Figure 8:
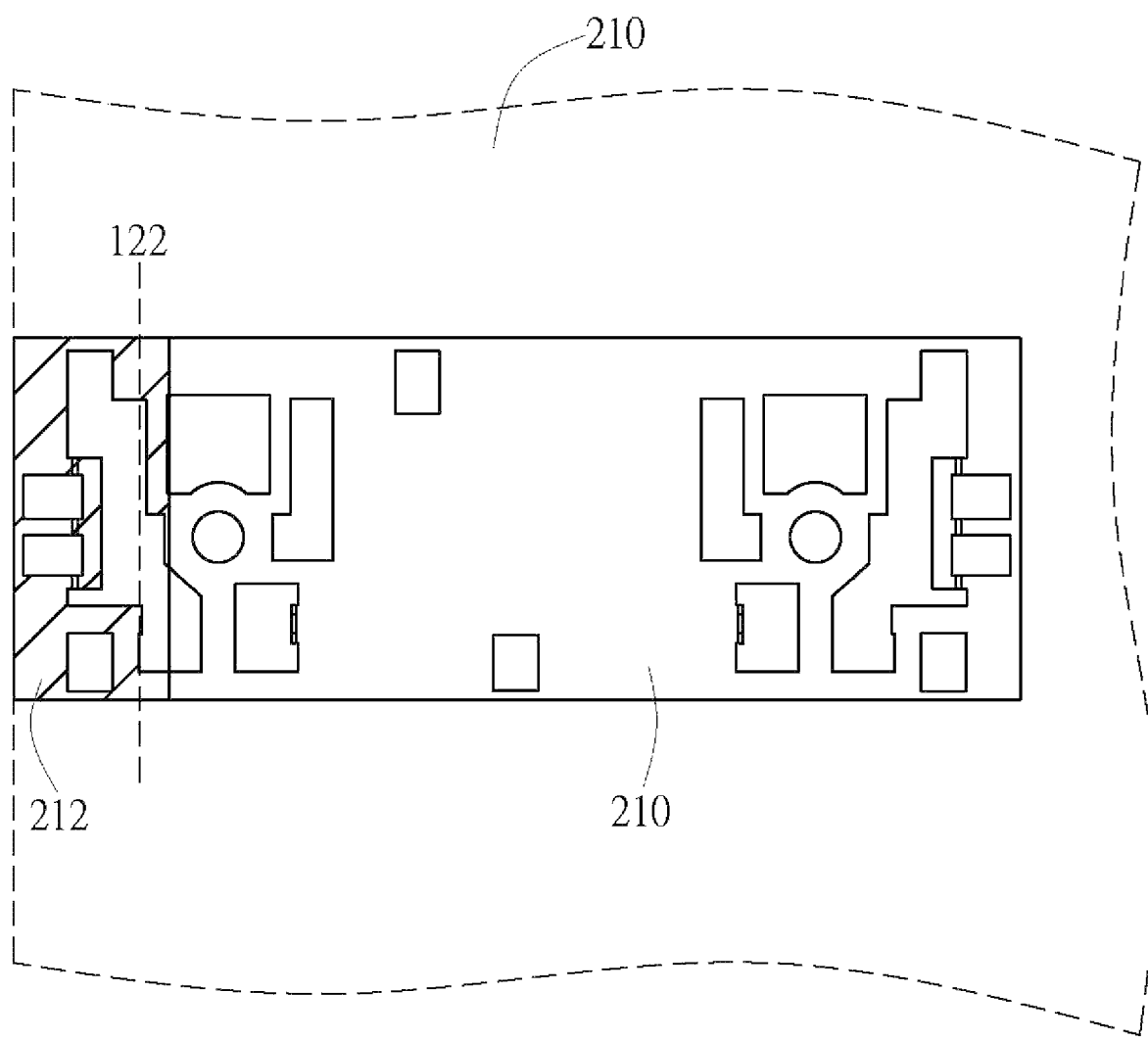
FIG. 8 is a partial top view of the keyswitch of the keyboard in the seventh embodiment of the invention, showing the relative position of the coating region of the baseplate and the light-exit edge of the light guide sheet.

FIG. 8 is a partial top view of the keyswitch of the keyboard in the seventh embodiment of the invention, which shows the relative position of the coating region 212 of the baseplate 210 and the light-exit edge 122 of the light guide sheet 120. FIG. 8 is a schematic view similar to FIG. 2C. Hereinafter, the differences between this embodiment and the above embodiments will be explained, and other details can refer to the related descriptions of the previous embodiments and will not elaborate again. As shown in FIG. 8, in this embodiment, the baseplate 210 has a coating region 212, and the coating region 212 corresponds to the light-exit edge 122 of the light guide sheet 120. Specifically, the coating region 212 can be coated on the side (e.g. the lower surface) of the baseplate 210 facing the mask film 110 along the light-exit edge 122, so that the light emitting through the outer light-transparent region 114A can be attenuated by the coating region (e.g. the coating region 212 formed by black ink), or can be scattered by the coating region (e.g. the coating region 212 formed by white ink), to enhance the lighting uniformity.

From the above descriptions, it can be understood that the luminous keyboard 1 of the invention is suitable for the slim border design, wherein the keyswitch module 20 includes a plurality of keyswitches 200 and a baseplate 210. The plurality of keyswitches 200 are disposed on the baseplate 210 and include at least one outer keyswitch 201 and at least one inner keyswitch 202. The outer keyswitch 201 includes a keycap 220 with an edge aligned with an edge of the baseplate 210. The inner keyswitch 202 is disposed on one side of the outer keyswitch 201 away from the edge of the baseplate 210. The optical module 10 described above can be disposed under the baseplate 210, so that the mask film 110 is closer to the baseplate 210 than the light guide sheet 120 is. The edge of the mask film 110 adjacent to the boundary 116 is substantially aligned with the edge of the baseplate 210. Moreover, the vertical projection of the keycap 220 of the outer keyswitch 201 on the mask film 110 exceeds outside the boundary 116 of the outer light-transparent region 114A.

It is noted that in other embodiments, one or more of the structure designs for enhancing the brightness of the outer keyswitch of the above various embodiments (e.g. the design of non-linear light-exit edge and/or hole of the light guide sheet, the design of auxiliary mask pattern and/or light-transparent sub-region of the mask film, the design of mask portion of the reflective film and/or the switch layer, the design of coating region of the baseplate) can be optionally integrated into one or more keyswitches of a single luminous keyboard, so as to improve the lighting uniformity of the luminous keyboard.

Although the preferred embodiments of the invention have been described herein, the above description is merely illustrative. The preferred embodiments disclosed will not limit the scope of the invention. Further modification of the invention herein disclosed will occur to those skilled in the respective arts and all such modifications are deemed to be within the scope of the invention as defined by the appended claims.

What is claimed is:

1. An optical module for a luminous keyboard comprising a plurality of keyswitches, comprising:
   a mask film having a mask pattern, the mask pattern defining a plurality of light-transparent regions respectively corresponding to the plurality of keyswitches, an outer light-transparent region of the plurality of light-transparent regions having a boundary closer to an edge of the mask film than an inner light-transparent region of the plurality of light-transparent regions; and
   a light guide sheet disposed on one side of the mask film along a stacking direction, the light guide sheet having a light-output surface overlapping the mask film in the stacking direction and a light-exit edge defining a boundary of the light-output surface, wherein on the mask film a vertical projection of the light-exit edge of the light guide sheet at least partially falls within the outer light-transparent region and is not parallel to the boundary of the outer light-transparent region of the mask film.

2. The optical module of claim 1, wherein in an extending direction of the boundary, the vertical projection of the light-exit edge is concave with respect to the boundary.

3. The optical module of claim 1, further comprising a reflective film on one side of the light guide sheet opposite to the mask film, wherein a mask portion is disposed between the reflective film and the light guide sheet and adjacent to the light-exit edge.

4. The optical module of claim 3, wherein the mask portion is an adhesive layer or a mask coating.

5. A luminous keyboard, comprising:
a keyswitch module comprising a plurality of keyswitches, the plurality of keyswitches comprising a switch layer; and
the optical module of claim 1 disposed under the switch layer, so that the mask film is closer to the switch layer than the light guide sheet is,
wherein the switch layer has one or more mask portions, and a vertical projection of the one or more mask portions on the mask film falls within the outer light-transparent region.

6. The luminous keyboard of claim 5, wherein the vertical projection of the light-exit edge at least partially falls within the vertical projection of the one or more mask portions.

7. An optical module for a luminous keyboard comprising a plurality of keyswitches, comprising:
a mask film having a mask pattern, the mask pattern defining a plurality of light-transparent regions respectively corresponding to the plurality of keyswitches, an outer light-transparent region of the plurality of light-transparent regions having a boundary closer to an edge of the mask film than an inner light-transparent region of the plurality of light-transparent regions; and
a light guide sheet disposed on one side of the mask film along a stacking direction, the light guide sheet having a light-output surface overlapping the mask film in the stacking direction, a light-exit edge defining a boundary of the light-output surface, and a hole in the light-output surface, wherein on the mask film a vertical projection of the light-exit edge of the light guide sheet at least partially falls within the outer light-transparent region, and on the mask film a vertical projection of the hole falls within the outer light-transparent region.

8. The optical module of claim 7, wherein the mask film further has an auxiliary mask pattern in the outer light-transparent region, and the vertical projection of the hole at least partially overlaps the auxiliary mask pattern.

9. The optical module of claim 7, further comprising a reflective film on one side of the light guide sheet opposite to the mask film, wherein a mask portion is disposed between the reflective film and the light guide sheet and adjacent to the light-exit edge.

10. The optical module of claim 9, wherein the mask portion is an adhesive layer or a mask coating.

11. A luminous keyboard, comprising:
a keyswitch module comprising a plurality of keyswitches, the plurality of keyswitches comprising a baseplate; and
the optical module of claim 7 disposed under the baseplate, so that the mask film is closer to the baseplate than the light guide sheet is,
wherein the baseplate has a coating region corresponding to the light-exit edge of the light guide sheet.

12. An optical module for a luminous keyboard comprising a plurality of keyswitches, comprising:
a mask film having a mask pattern, the mask pattern defining a plurality of light-transparent regions and a plurality of light-transparent sub-regions, the plurality of light-transparent regions respectively corresponding to the plurality of keyswitches, an outer light-transparent region of the plurality of light-transparent regions having a boundary closer to an edge of the mask film than an inner light-transparent region of the plurality of light-transparent regions, the plurality of light-transparent sub-regions disposed adjacent to the outer light-transparent region away from the inner light-transparent region; and
a light guide sheet disposed on one side of the mask film along a stacking direction, the light guide sheet having a light-output surface overlapping the mask film in the stacking direction and a light-exit edge defining a boundary of the light-output surface, wherein on the mask film a vertical projection of the light-exit edge of the light guide sheet at least partially falls within the plurality of light-transparent sub-regions.

13. The optical module of claim 12, further comprising a reflective film on one side of the light guide sheet opposite to the mask film, wherein a mask portion is disposed between the reflective film and the light guide sheet and adjacent to the light-exit edge.

14. The optical module of claim 13, wherein the mask portion is an adhesive layer or a mask coating.

15. A luminous keyboard, comprising:
a keyswitch module comprising a baseplate and a plurality of keyswitches on the baseplate, the plurality of keyswitches comprising at least one outer keyswitch and at least one inner keyswitch, the at least one outer keyswitch comprising a keycap with an edge aligned with an edge of the baseplate, the at least one inner keyswitch disposed on one side of the at least one outer keyswitch away from the edge of the baseplate; and
the optical module of claim 12 disposed under the baseplate, so that the mask film is closer to the baseplate than the light guide sheet is,
wherein the edge of the mask film is substantially aligned with the edge of the baseplate.

16. The luminous keyboard of claim 15, wherein on the mask film a vertical projection of the keycap of the at least one outer keyswitch exceeds outside the boundary of the outer light-transparent region.

* * * * *